(12) United States Patent
Wright et al.

(10) Patent No.: US 9,025,340 B2
(45) Date of Patent: May 5, 2015

(54) DEVICES AND STACKED MICROELECTRONIC PACKAGES WITH IN-TRENCH PACKAGE SURFACE CONDUCTORS AND METHODS OF THEIR FABRICATION

(71) Applicants: Jason R. Wright, Chandler, AZ (US); Michael B. Vincent, Chandler, AZ (US); Weng F. Yap, Chandler, AZ (US)

(72) Inventors: Jason R. Wright, Chandler, AZ (US); Michael B. Vincent, Chandler, AZ (US); Weng F. Yap, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 17 days.

(21) Appl. No.: 14/042,628

(22) Filed: Sep. 30, 2013

(65) Prior Publication Data
US 2015/0092377 A1 Apr. 2, 2015

(51) Int. Cl.
| H05K 7/10 | (2006.01) |
| H05K 7/12 | (2006.01) |
| H05K 1/11 | (2006.01) |
| H05K 1/09 | (2006.01) |
| H05K 3/12 | (2006.01) |
| H05K 3/14 | (2006.01) |
| H05K 3/26 | (2006.01) |
| H05K 3/04 | (2006.01) |
| H05K 3/06 | (2006.01) |
| H05K 3/08 | (2006.01) |

(52) U.S. Cl.
CPC .. H05K 1/11 (2013.01); H05K 1/09 (2013.01); H05K 3/125 (2013.01); H05K 3/1216 (2013.01); H05K 3/1258 (2013.01); H05K 3/14 (2013.01); H05K 3/26 (2013.01); H05K 3/043 (2013.01); H05K 3/06 (2013.01); H05K 3/08 (2013.01)

(58) Field of Classification Search
USPC ......................................... 361/767, 752, 808
See application file for complete search history.

(56) References Cited

U.S. PATENT DOCUMENTS

| 4,866,501 A | 9/1989 | Shanefield |
| 5,019,946 A | 5/1991 | Eichelberger et al. |
| 5,279,991 A | 1/1994 | Minahan et al. |
| 5,432,729 A | 7/1995 | Carson et al. |
| 5,465,186 A | 11/1995 | Bajorek et al. |

(Continued)

OTHER PUBLICATIONS

U.S. Appl. No. 13/591,969, Office Action—Rejection, mailed Sep. 13, 2013.

(Continued)

*Primary Examiner* — Andargie M Aychillhum
(74) *Attorney, Agent, or Firm* — Sherry W. Schumm

(57) ABSTRACT

Embodiments of methods for forming microelectronic device packages include forming a trench on a surface of a package body between exposed ends of first and second device-to-edge conductors, and forming a package surface conductor in the trench to electrically couple the first and second device-to-edge conductors. In one embodiment, the package surface conductor is formed by first forming a conductive material layer over the package surface, where the conductive material layer substantially fills the trench, and subsequently removing portions of the conductive material layer from the package surface adjacent to the trench. In another embodiment, the package surface conductor is formed by dispensing one or more conductive materials in the trench between the first and second exposed ends (e.g., using a technique such as spraying, inkjet printing, aerosol jet printing, stencil printing, or needle dispense). Excess conductive material may then be removed from the package surface adjacent to the trench.

4 Claims, 9 Drawing Sheets

(56) References Cited

U.S. PATENT DOCUMENTS

| | | | |
|---|---|---|---|
| 5,675,180 | A | 10/1997 | Pedersen et al. |
| 5,847,448 | A | 12/1998 | Val et al. |
| 5,977,640 | A | 11/1999 | Bertin et al. |
| 6,467,880 | B2 | 10/2002 | Rhodes |
| 6,560,109 | B2 | 5/2003 | Yamaguchi et al. |
| 6,607,941 | B2 | 8/2003 | Prabhu et al. |
| 6,818,977 | B2 | 11/2004 | Poo et al. |
| 6,822,191 | B2 | 11/2004 | De Steur et al. |
| 6,855,572 | B2 | 2/2005 | Jeung et al. |
| 7,394,152 | B2 | 7/2008 | Yu et al. |
| 7,560,215 | B2 | 7/2009 | Sharma et al. |
| 7,723,159 | B2 | 5/2010 | Do et al. |
| 7,732,907 | B2 | 6/2010 | Han et al. |
| 7,741,156 | B2 | 6/2010 | Pagaila et al. |
| 7,759,800 | B2 | 7/2010 | Rigg et al. |
| 7,829,998 | B2 | 11/2010 | Do et al. |
| 7,838,979 | B2 | 11/2010 | Oh |
| 7,843,046 | B2 | 11/2010 | Andrews et al. |
| 7,951,649 | B2 | 5/2011 | Val |
| 7,972,650 | B1 | 7/2011 | Church et al. |
| 7,994,621 | B2 | 8/2011 | Kim |
| 8,012,802 | B2 | 9/2011 | Sasaki et al. |
| 8,247,268 | B2 | 8/2012 | Do et al. |
| 8,362,621 | B2 | 1/2013 | Lee et al. |
| 2002/0121702 | A1 | 9/2002 | Higgins, III |
| 2003/0138610 | A1 | 7/2003 | Tao |
| 2006/0043569 | A1 | 3/2006 | Benson et al. |
| 2008/0274603 | A1 | 11/2008 | Do et al. |
| 2009/0039528 | A1 | 2/2009 | Haba et al. |
| 2009/0134527 | A1 | 5/2009 | Chang |
| 2009/0160065 | A1 | 6/2009 | Haba et al. |
| 2009/0230533 | A1 | 9/2009 | Hoshino et al. |
| 2010/0001407 | A1 | 1/2010 | Krause et al. |
| 2010/0140811 | A1 | 6/2010 | Leal et al. |
| 2010/0270668 | A1 | 10/2010 | Marcoux |
| 2010/0320584 | A1 | 12/2010 | Takano |
| 2011/0012246 | A1 | 1/2011 | Andrews, Jr. et al. |
| 2011/0037159 | A1 | 2/2011 | McElrea et al. |
| 2012/0119385 | A1 | 5/2012 | Co et al. |
| 2012/0187577 | A1 | 7/2012 | Cordes et al. |
| 2012/0193785 | A1 | 8/2012 | Lin et al. |
| 2013/0010441 | A1 | 1/2013 | Oganesian et al. |
| 2013/0049225 | A1 | 2/2013 | Kang et al. |
| 2014/0054783 | A1* | 2/2014 | Gong et al. .............. 257/773 |
| 2014/0054797 | A1* | 2/2014 | Gong et al. .............. 257/777 |

OTHER PUBLICATIONS

U.S. Appl. No. 13/591,990, Office Action—Rejection, mailed Jul. 5, 2013.
U.S. Appl. No. 13/591,990, Office Action—Rejection, mailed Dec. 19, 2013.
U.S. Appl. No. 13/591,924, Gong, Z., et al., "Stacked MicroElectronic Packages Having Sidewall Conductors and methods for the Fabrication Thereof", filed Aug. 22, 2012.
U.S. Appl. No. 13/591,969, Gong, Z., et al., "Stacked microelectronic Packages Having Patterned Sidewall Conductors and Methods for the Fabrication Thereof", filed Aug. 22, 2012.
U.S. Appl. No. 13/591,990, Vincent, M.B., et al., "Stacked Microelectronic Packages Having Sidewall Conductors and methods for the Fabrication Thereof", filed Aug. 22, 2012.
U.S. Appl. No. 13/906,621, Yap, W.F., et al., "Stacked Microelectronic Packages Having Sidewall Conductors and methods for the Fabrication Thereof", filed May 31, 2013.
U.S. Appl. No. 13/829,737, Yap, W.F., et al., "Stacked Microelectronic Packages Having Sidewall Conductors and Methods for the Fabrication Thereof", filed Mar. 14, 2013.
U.S. Appl. No. 14/042,623, Vincent, M.B., et al., "Devices and Stacked Microelectronic Packages with Parallel Conductors and Intra-conductor Isolator Structures and Methods of Their Fabrication", filed Sep. 30, 2013.
U.S. Appl. No. 13/829,737, Office Action—Restriction, mailed May 23, 2014.
U.S. Appl. No. 13/829,737, Office Action—Pre-Interview Communication (Pilot Program), mailed Aug. 14, 2014.
Rabaey, J. et al., "Digital Integrated Circuits," Jan. 2003, Pearson Education, 2nd Ed. 38-40.
Restriction Requirement mailed Apr. 11, 2014 for U.S. Appl. No. 13/591,924, 9 pages.
Non-Final Office Action mailed Jul. 24, 2014 for U.S. Appl. No. 13/591,924, 16 pages.
Final Office Action mailed Nov. 19, 2014 for U.S. Appl. No. 13/591,924, 21 pages.
Final Office Action mailed Feb. 14, 2014 for U.S. Appl. No. 13/591,969 16 pages.
Final Office Action mailed Sep. 22, 2014 for U.S. Appl. No. 13/591,969 17 pages.
Notice of Allowance mailed Jan. 28, 2015 for U.S. Appl. No. 13/591,969 7 pages.
Restriction Requirement mailed Mar. 29, 2013 for U.S. Appl. No. 13/591,990, 4 pages.
Notice of Allowance mailed Jan. 8, 2015 for U.S. Appl. No. 13/591,990, 6 pages.
Non-Final Office Action mailed Nov. 18, 2014 for U.S. Appl. No. 13/906,621, 5 pages.
Final Office Action mailed Dec. 5, 2014 for U.S. Appl. No. 13/829,737, 10 pages.
U.S. Appl. No. 14/573,519, filed Dec. 17, 2014, entitled "Microelectronic Devices with Mutli-Layer Package Surface Conductors and Methods of Their Fabrication".
U.S. Appl. No. 14/097,424, filed Dec. 5, 2013, entitled "Devices and Stacked Microelectronic Packages with Package Surface Conductors and Methods of Their Fabrication".
U.S. Appl. No. 14/097,459, filed Dec. 5, 2013, entitled "Devices and Stacked Microelectronic Packages with Package Surface Conductors and Adjacent Trenches and Methods of Their Fabrication".
Non-Final Office Action mailed Mar. 6, 2015 for U.S. Appl. No. 13/591,924, 8 pages.
Notice of Allowance mailed Feb. 17, 2015 for U.S. Appl. No. 13/591,990, 5 pages.
Notice of Allowance mailed Mar. 5, 2015 for U.S. Appl. No. 14/042,623, 14 pages.
Non-Final Office Action mailed Mar. 6, 2015 for U.S. Appl. No. 13/829,737, 11 pages.
Restriction Requirement mailed Jan. 29, 2015 for U.S. Appl. No. 14/097,424, 8 pgs.
Non-Final Office Action mailed Feb. 12, 2015 for U.S. Appl. No. 14/097,459, 16 pages.

* cited by examiner

US 9,025,340 B2

DEVICES AND STACKED MICROELECTRONIC PACKAGES WITH IN-TRENCH PACKAGE SURFACE CONDUCTORS AND METHODS OF THEIR FABRICATION

TECHNICAL FIELD

Embodiments of the present disclosure relate generally to microelectronic packaging and, more particularly, to devices and stacked microelectronic packages having surface conductors and methods for the fabrication thereof.

BACKGROUND

It is often useful to combine multiple microelectronic devices, such as semiconductor die carrying integrated circuits (ICs), micro-electromechanical systems (MEMS), optical devices, passive electronic components, and the like, into a single package that is both compact and structurally robust. Packaging of microelectronic devices has traditionally been carried-out utilizing a so-called two dimensional (2D) or non-stacked approach in which two or more microelectronic devices are positioned and interconnected in a side-by-side or laterally adjacent spatial relationship. More particularly, in the case of ICs formed on semiconductor die, packaging has commonly entailed the mounting of multiple die to a package substrate and the formation of desired electrical connections through wire bonding or flip-chip connections. The 2D microelectronic package may then later be incorporated into a larger electronic system by mounting the package substrate to a printed circuit board (PCB) or other component included within the electronic system.

As an alternative to 2D packaging technologies of the type described above, three dimensional (3D) packaging technologies have recently been developed in which microelectronic devices are disposed in a stacked arrangement and vertically interconnected to produce a stacked, 3D microelectronic package. Such 3D packaging techniques yield highly compact microelectronic packages well-suited for usage within mobile phones, digital cameras, digital music players, biomedical devices, and other compact electronic devices. Additionally, such 3D packaging techniques may enhance device performance by reducing interconnection length, and thus signal delay, between the packaged microelectronic devices.

BRIEF DESCRIPTION OF THE DRAWINGS

Embodiments of the present disclosure will hereinafter be described in conjunction with the following figures, wherein like numerals denote like elements, and.

Figure 1:
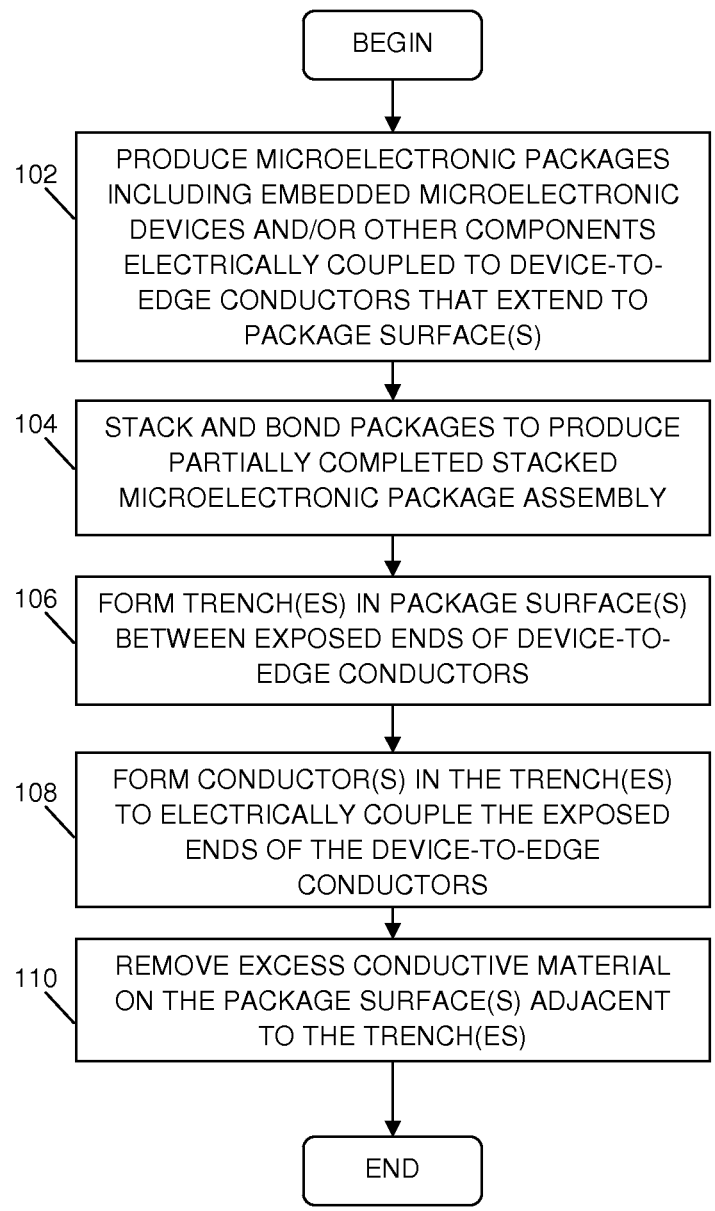
FIG. 1 is a flowchart of a method for fabricating a stacked microelectronic package assembly, according to an embodiment.

For simplicity and clarity of illustration, the drawing figures illustrate the general manner of construction and may omit depiction, descriptions, and details of well-known features and techniques to avoid unnecessarily obscuring the non-limiting embodiments of the disclosure described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the disclosure.

DETAILED DESCRIPTION

The following Detailed Description is merely illustrative in nature and is not intended to limit the disclosure or the application and uses of the disclosure. Any implementation described herein as is not necessarily to be construed as preferred or advantageous over other implementations. Furthermore, there is no intention to be bound by any theory presented in the preceding Background or the following Detailed Description.

As used herein, the term "microelectronic device" is utilized in a broad sense to refer to an electronic device, element, or component produced on a relatively small scale and amenable to packaging in the below-described manner. Microelectronic devices include, but are not limited to, integrated circuits (ICs) formed on semiconductor die, micro-electromechanical systems (MEMS), passive electronic components, optical devices, and other small scale electronic devices capable of providing processing, memory, sensing, radio frequency communication, radar, optical functionalities, and actuator functionalities, to list but a few examples. The term "microelectronic package" denotes a structure containing at least one and typically two or more microelectronic devices, which may or may not be electrically interconnected. A microelectronic package may include, for example, one or more microelectronic devices, packaging material (e.g., encapsulant) substantially surrounding the microelectronic devices, one or more patterned conductive layers and other conductive structures (e.g., vias and the like) that provide electrical connectivity with the microelectronic device(s), and one or more contacts for electrically coupling the microelectronic devices of the microelectronic package with external electrical systems. For example, a microelectronic package may be a "fan out wafer level" type of package, also referred to as a "redistributed chip package" (RCP). The term "stacked microelectronic package assembly" refers to an assembly containing at least two microelectronic packages stacked together and physically coupled. According to an embodiment, a bottom package in a stacked microelectronic package may include contact pads on its bottom surface (e.g., ball grid array pads), which enable the stacked microelectronic package to be electrically and physically connected to a printed circuit board (PCB) or other substrate. In addition, in still other embodiments, a top package in a stacked microelectronic package may include contact pads on its top surface, and one or more other devices may be surface mounted to the top surface of the top package.

As will be described in more detail below, an embodiment of a microelectronic package includes at least one "device-to-edge conductor," which is a conductive structure that extends between one or more embedded microelectronic devices or other electrical components and a surface of the microelectronic package (e.g., a sidewall, a top surface, a bottom surface, or a surface that ultimately is embedded within the microelectronic package). In some embodiments, electrical interconnections (referred to herein as "package sidewall conductors" or "package surface conductors") may be formed in trenches in a package surface between exposed ends of device-to-edge conductors of a single microelectronic package. Because the package surface conductors are formed in trenches, they may be referred to as "in-trench" package surface conductors. The description, below, refers primarily to "package sidewall conductors," referring to embodiments in which the conductors are formed within trenches in package sidewalls. However, it should be understood that the description and the various embodiments may apply equally to conductors that are formed in trenches in other package surfaces, as well. Therefore, each of the below described embodiments extend to embodiments implemented on package sidewalls and other package surfaces. In other embodiments, multiple microelectronic packages with device-to-edge conductors may be stacked together to form a stacked microelectronic package assembly, and package sidewall conductors may be formed between exposed ends of device-to-edge conductors of different microelectronic packages of the stacked microelectronic package assembly. The "exposed end" of a device-to-edge conductor may be referred to herein as a "pad."

A device that includes a single microelectronic package or multiple microelectronic packages in a stacked arrangement may be considered to include a "package body," and one or more device-to-edge conductors may extend to the sidewalls and/or other surfaces of the package body. As used herein, the term "package body" may mean the structural package components of a single microelectronic package or the structural package components of multiple microelectronic packages in a stacked arrangement, where the "structural package components" are those portions of the device that define the shape of the device and hold the electrical components in a fixed orientation with each other.

In some cases, it may be desirable to form package surface conductors that are adjacent to but electrically isolated from each other. Some package surface conductor fabrication techniques may produce package sidewall conductors with conductive material that extends beyond the intended design widths of the package sidewall conductors (e.g., due to overspray or bleeding of the conductive material as it is being deposited). Using conventional fabrication techniques, to avoid shorting or high resistance leakage between adjacent package sidewall conductors, the pitch between the adjacent package sidewall conductors should be selected to avoid such potential shorting or leakage. However, this may yield assemblies with a relatively large pitch between adjacent package sidewall conductors. According to various embodiments described herein, the pitch between adjacent package sidewall conductors may be reduced, when compared with conventional structures, while still achieving acceptable electrical isolation between adjacent package sidewall conductors. In other words, the sidewall conductors formed pursuant to embodiments of the below-described fabrication methods may be formed with a relatively fine pitch between conductors.

The following describes embodiments of package surface conductors formed in trenches on one or more surfaces of a microelectronic package, microelectronic devices, stacked microelectronic package assemblies, and methods of their formation. As will be apparent from the below description, the package surface conductors can be utilized to provide a convenient manner in which microelectronic devices contained within one or more microelectronic packages can be electrically coupled.

FIG. 1 is a flowchart of an embodiment of a method for fabricating a stacked microelectronic package assembly, according to an embodiment. The completed microelectronic package assembly produced pursuant to the below-described method may also be referred to as a Package-on-Package (PoP) device or a System-in-Package (SiP) device, depending upon the particular manner in which the completed microelectronic package assembly is implemented. Although a result of the performance of the method of FIG. 1 is a microelectronic package assembly that includes multiple, stacked microelectronic packages, it should be understood that embodiments of the inventive subject matter may be utilized with a single microelectronic package, as well.

As shown in FIG. 1 and described in detail below, the method is offered by way of non-limiting example only. It is emphasized that the fabrication steps shown in FIG. 1 can be performed in alternative orders, that certain steps may be omitted, and that additional steps may be performed in further embodiments. Furthermore, various steps in the manufacture of a stacked microelectronic package assembly or certain components included within a stacked microelectronic package assembly are well-known and, in the interests of brevity, will only be mentioned briefly herein or will be omitted entirely without providing the well-known process details. It will be appreciated that method can be utilized to produce various other types of stacked microelectronic package assemblies having configurations that are different from those included in the Figures.

Referring to FIG. 1, the method begins with the production of a number of microelectronic packages in process 102. More particularly, as will be described in detail below, process 102 results in the production of a number of microelectronic packages that include embedded microelectronic devices and/or other components that are electrically coupled to device-to-edge conductors that extend to one or more package surfaces. Any method suitable for fabricating a stackable package or microelectronic package having at least one electrically-conductive element exposed through a package sidewall and electrically coupled to a microelectronic device contained within the microelectronic package can be carried-out during process 102. Embodiments of the inventive subject matter may be implemented in various types of microelectronic packages that can be fabricated to include device-to-edge conductors that extend to one or more surfaces of the package, including but not limited to substrate based wirebond packages, flip chip packages, and redistributed chip packages (RCP), for example. Although embodiments illustrated in the figures and discussed below pertain to RCP types of packages, it is to be understood that the inventive subject matter is not limited to application only in RCP types of packages.

Figure 2:
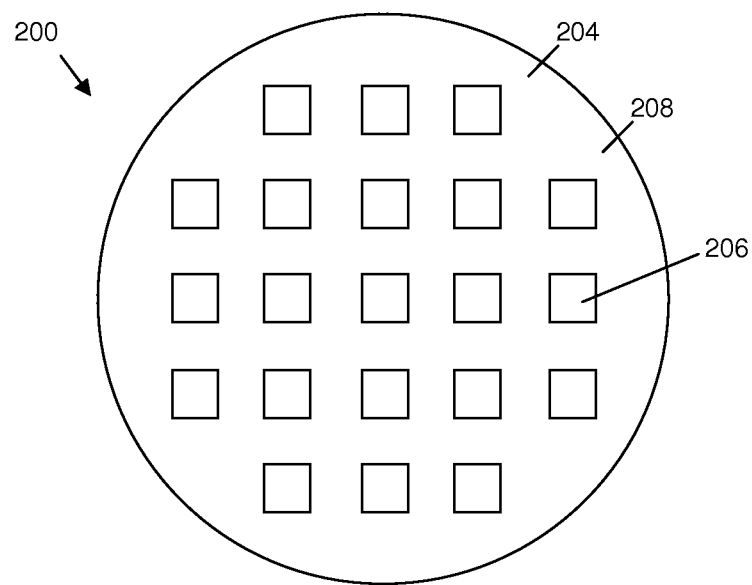
FIG. 2 is a top-down view illustrating a partially-completed microelectronic device panel, according to an embodiment.

FIGS. 2-5 illustrate various stages in the production of an embodiment of a microelectronic package. More specifically, FIG. 2 is a top-down view illustrating a partially-completed microelectronic device panel 200, which corresponds to a first stage of production of an embodiment of a microelectronic package (e.g., a first stage of production carried out in conjunction with process 102, FIG. 1). According to an embodiment, microelectronic device panel 200 may be produced utilizing an RCP process or another chips-first packaging technique. More specifically, microelectronic device panel 200 includes a panel body 208 in which a plurality of microelectronic devices 206 are embedded. Microelectronic devices 206 may be substantially identical or may instead vary in type, function, size, and so on. For example, some of devices 206 may be devices of a first type (e.g., an application specific integrated circuit (ASIC) die, a microprocessor, or another type of device), while others of devices 206 may be devices of a second type (e.g., a MEMS device or another type of device). According to an embodiment, devices 206 have contact bearing surfaces that are exposed through major surface 204 of panel body 208 (referred to herein as "panel surface 204"). In the illustrated example, device panel 200 includes twenty one square-shaped devices 206 arranged in a grid pattern or array. However, the number of microelectronic devices, the planform dimensions of the microelectronic devices (e.g., the die shape and size), and the manner in which the devices are spatially distributed within panel body 208 may vary amongst embodiments. Panel body 208 is typically produced as a relatively thin, disc-shaped body or mass having a generally circular planform geometry. However, panel body 208 can be fabricated to have any desired shape and dimensions. In various embodiments, panel body 208 can have a thickness that is less than, equivalent to, or slightly exceeding the original height of microelectronic devices 206 to minimize the overall vertical profile of the completed stacked microelectronic package assembly.

According to an embodiment, microelectronic device panel 200 may be produced as follows. First, microelectronic devices 206 are positioned in a desired spatial arrangement over the surface of a support substrate or carrier (not shown), with their contact bearing surfaces in contact with the carrier. For example, devices 206 may be arranged over the carrier in a grid array of the type shown in FIG. 2. If desired, one or more release layers may also be applied or formed over the carrier's upper surface prior to positioning of microelectronic devices 206. A mold frame with a central cavity or opening therethrough may be positioned over the carrier and around the array of microelectronic devices 206. An encapsulant, such as a silica-filled epoxy, may then be dispensed into the cavity of the mold frame and allowed to flow over microelectronic devices 206. Sufficient volume of the encapsulant may be dispensed over microelectronic devices 206 to enable the encapsulant to flow over the uppermost or non-contact-bearing surfaces of the microelectronic devices 206. The encapsulant may then be solidified by, for example, an oven cure to yield a solid panel body 208 in which microelectronic devices 206 are embedded. Panel body 208 may be rigid or flexible, depending upon the chosen encapsulant. Panel body 208 may then be released from the carrier to reveal the backside of body 208 through which the contact-bearing surfaces of microelectronic devices 206 are exposed (e.g., panel surface 204 in the embodiment shown in FIG. 2). If desired, the front side of panel body 208 may be ground or polished to bring device panel 200 to a desired thickness prior to release of the panel body from the carrier. The foregoing example notwithstanding, panel body 208 can be produced utilizing various other known fabrication techniques including, for example, compression molding and lamination processes.

After encapsulation of microelectronic devices 206 within panel body 208, a plurality of device-to-edge conductors may be fabricated over panel surface 204 of microelectronic device panel 200. In other embodiments, device-to-edge conductors may be formed entirely or partially at or below the panel surface (e.g., portions of the device-to-edge conductors may be embedded within or at the surface of the encapsulant or package). The term "device-to-edge conductor," as used herein, refers to an electrically-conductive structure or element, such as a metal trace, a wire, an interconnect line, a metal-filled trench, a bond pad, a combination thereof, or the like. Each device-to-edge conductor is electrically coupled to an electrical component that is embedded in a microelectronic package and/or that has at a connection point (to the device-to-edge conductor) that is not co-located with the package surface on which surface conductors are to be formed (e.g., a microelectronic device or other electrical component embedded within a microelectronic package, a bond pad on a bottom surface of the device, and so on). In addition, each device-to-edge conductor extends to a sidewall or other surface of the package to contact a package surface conductor, such as the sidewall conductors described below in conjunction with FIGS. 8-17. The device-to-edge conductors can assume a wide variety of different forms. In some embodiments, a device-to-edge conductor may consist of or include a combination of one or more electrically-conductive lines (e.g., metal traces), vias, metal plugs, leadframes, and/or other conductive features, which are formed on, between, and/or through one or more dielectric layers. The conductive lines may be included within one or more layers that may be referred to as "build-up layers," "metal layers," or "redistribution layers" (RDLs). Collectively, the conductive features provide an electrically conductive path between an encapsulated microelectronic device 206 and a package surface conductor to be formed later on the package sidewall, as described below in conjunction with FIGS. 8-17.

Figure 3:
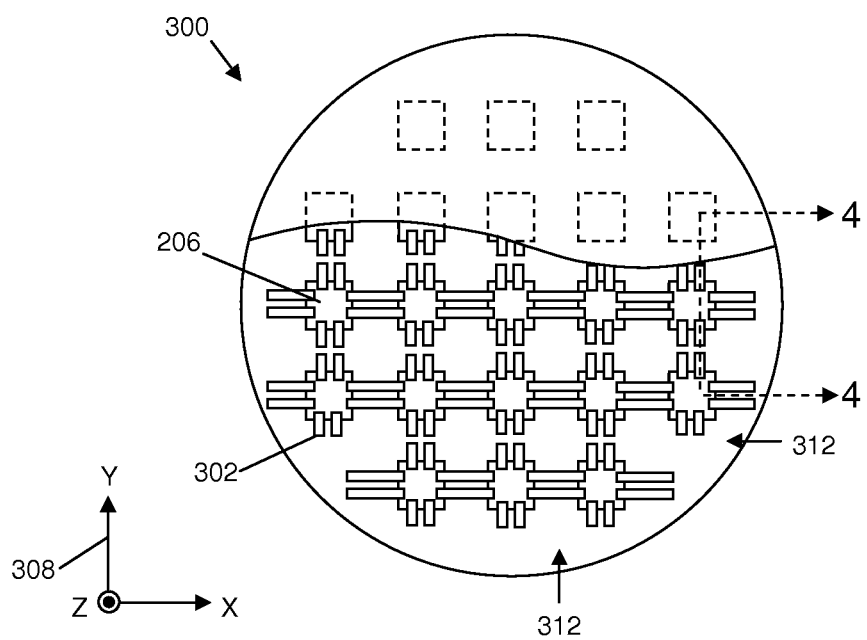
FIG. 3 illustrates a top-down view illustrating the partially-completed microelectronic device panel of FIG. 2 at a later stage of production, according to an embodiment.
Figure 4:
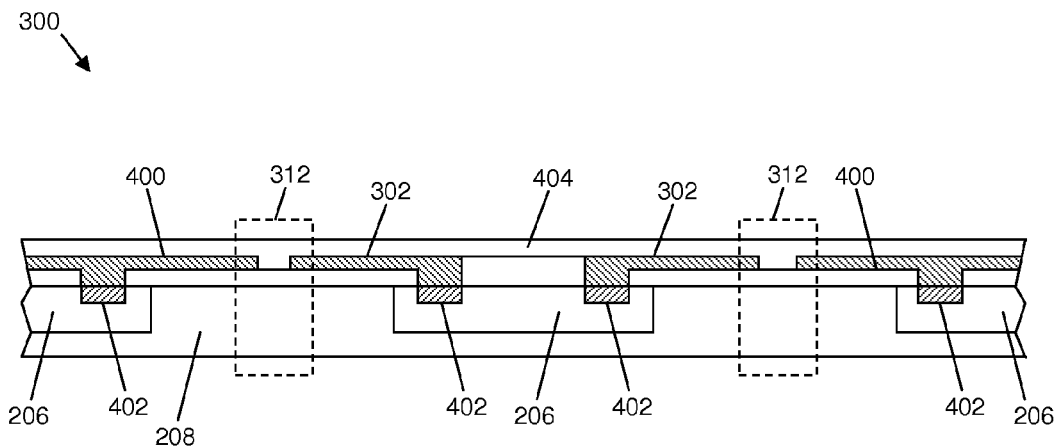
FIG. 4 is a cross-sectional view of a portion of the microelectronic device panel of FIG. 3, according to an embodiment.

FIG. 3 illustrates a top-down view of a partially-completed microelectronic device panel 300 at a later stage of production of an embodiment of a microelectronic package (e.g., a next stage of production carried out in conjunction with process 102, FIG. 1), and FIG. 4 is a cross-sectional view of a portion of the microelectronic device panel 300 of FIG. 3 along line 4-4, according to an embodiment. In FIG. 3, microelectronic device panel 300 represents a partially cut-away version of device panel 200 after one or more build-up layers (including device-to-edge conductors 302) have been formed over device surface 204 (FIG. 2). The cut-away portion of FIG. 3 shows a number of device-to-edge conductors 302 that can be included in one or more build-up layers over device surface 204 during production of microelectronic device panel 300. As shown in FIGS. 3 and 4, device-to-edge conductors 302 may include a number of interconnect lines or metal (e.g., copper) traces. The trace portions of the device-to-edge conductors 302 may extend along a plane parallel with device surface 204 or, stated differently, along the x-y plane identified in FIG. 3 by coordinate legend 308. Device-to-edge conductors 302 can be produced using bumping or wafer level packaging fabrication techniques such as sputtering, plating, jetting, photolithography, and/or stencil printing (e.g., of an electrically-conductive ink), to list but a few examples. Device-to-edge conductors 302 may be formed on or between one or more layers of dielectric material 400, for example.

As may be appreciated most readily with reference to FIG. 4, device-to-edge conductors 302 are electrically coupled to a number of landing pads or other electrical contact points 402 provided on each microelectronic device 206. Device-to-edge conductors 302 may be electrically connected to device contact points 402 by filled vias, plated vias, metal plugs, or the like formed through the dielectric layer 400 or layers underlying the trace portions of device-to-edge conductors 302. After formation of device-to-edge conductors 302, one or more overlying dielectric, capping, or passivation layers 404 may be formed over device-to-edge conductors 302 utilizing a spin-on coating process, printing, lamination, or another deposition technique.

According to an embodiment, device-to-edge conductors 302 extend from their respective microelectronic devices 206 to neighboring dicing streets 312, which surround or border each device 206. Dicing streets 312 represent portions of device panel 300 located between and around devices 206. According to an embodiment, dicing streets 312 do not include electrically-active elements, and the material within the dicing streets 312 is removed during singulation to yield individual microelectronic packages. Dicing streets 312 are also commonly referred to as "saw streets". However, the term "dicing streets" is used herein to emphasize that, while singulation can be accomplished through a mechanical sawing process, other dicing techniques can be employed to separate the microelectronic packages during singulation including, for example, laser cutting and scribing with punching. As shown in the embodiment illustrated in FIGS. 3 and 4, neighboring device-to-edge conductors 302, which extend along aligning axes (e.g., x- and/or y-axes of coordinate system 308), can be formed to connect or meet within dicing streets 312 and thereby form a continuous conductive line extending between neighboring microelectronic devices 206, as is the case for device-to-edge conductors 302 that are aligned in parallel with the x-axis in FIG. 3. However, the portions of device-to-edge conductors 302 extending into dicing streets 312 alternatively may not be continuous between neighboring microelectronic devices 206, as is the case for device-to-edge conductors 302 that are aligned in parallel with the y-axis in FIG. 3.

While a single layer or level of device-to-edge conductors 302 are shown to be included in microelectronic panel 300 in the example embodiment shown in FIGS. 3 and 4, multiple layers or levels of device-to-edge conductors 302 can be included within a microelectronic panel, in other embodiments. Furthermore, in embodiments in which one or more of the individual microelectronic packages include multiple embedded microelectronic devices, additional conductors may also be formed at this juncture in the fabrication process in conjunction with the formation of device-to-edge conductors 302, where those additional conductors may serve to interconnect the multiple devices included within each microelectronic package.

Figure 5:
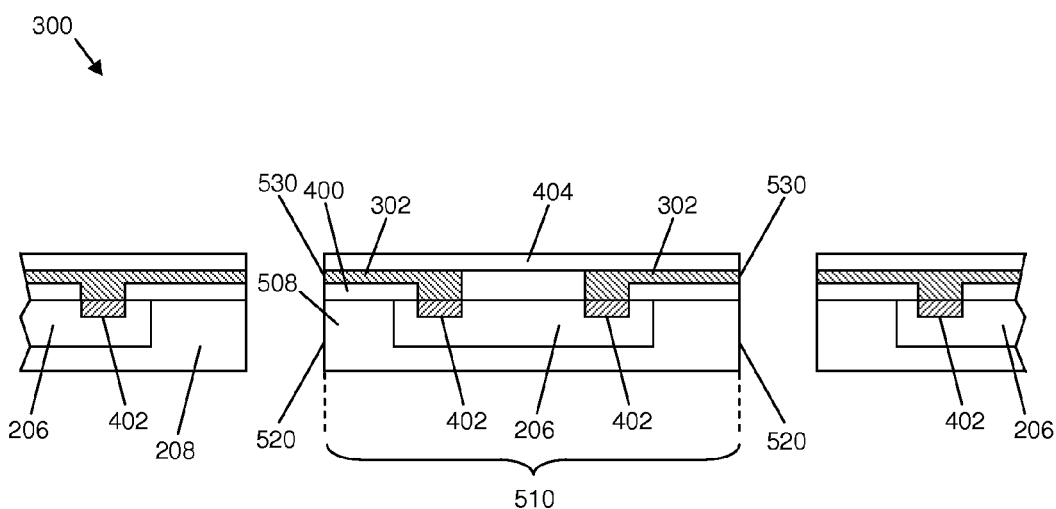
FIG. 5 illustrates a cross-sectional view of the portion of the microelectronic device panel of FIG. 4 after singulation, according to an embodiment.
Figure 17:
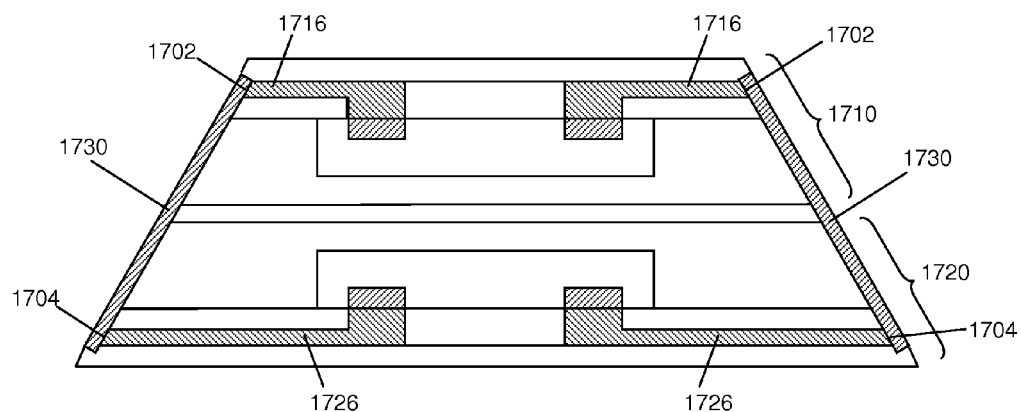
FIG. 17 illustrates a cross-sectional, side view of a completed stacked microelectronic package assembly, according to yet another embodiment.

Referring now to FIG. 5, microelectronic device panel 300 is singulated to complete production of the microelectronic packages during process 102 of method 100 (FIG. 1). More particularly, singulation produces a microelectronic package 510 that includes one or more microelectronic devices 206 embedded in a microelectronic package body 508, and a plurality of device-to-edge conductors 302 (e.g., including metal traces) extending from electrical contact points 402 of the device(s) 206 to the package sidewalls 520. As previously indicated, panel singulation can be carried-out by mechanical sawing. However, any suitable separation process can be utilized, including laser cutting and scribing with punching. In one embodiment, singulation is performed utilizing a conventional dicing saw, such as a water-cooled diamond saw. FIG. 5 illustrates, in cross-sectional view, a portion of microelectronic device panel 300 after singulation to yield a plurality of microelectronic packages 510 (only one of which is fully shown and identified in FIG. 5). According to an embodiment, each microelectronic package 510 is cut to have a substantially rectangular shape and to include four package edges or sidewalls 520 that are substantially orthogonal with respect to the package top and bottom surfaces. In another embodiment, singulated microelectronic packages may have package sidewalls that are not orthogonal to the top and bottom surfaces of the package (e.g., as depicted in the embodiment of FIG. 17, described later).

Either way, as device-to-edge conductors 302 were previously formed to extend into dicing streets 312 (now removed), distal ends 530 of the device-to-edge conductors 302 extend to and are exposed at the sidewalls 520 of the singulated microelectronic packages 510. The ends of the device-to-edge conductors 302 also are referred to herein as "sidewall pads" or "package surface pads" herein. In various embodiments, a microelectronic package 510 may be configured so that device-to-edge conductors 302 extend to each of the four package sidewalls 520. However, in other embodiments, a microelectronic package may be configured so that device-to-edge conductors 302 extend to fewer than all of the package sidewalls (e.g., to one, two, or three sidewalls) and/or to other package surfaces.

Referring again to FIG. 1, in process 104, a singulated microelectronic package (e.g., microelectronic package 510 produced during process 102) may be combined with (e.g., stacked and bonded with) one or more additional microelectronic packages to produce a partially-completed stacked microelectronic package assembly. For example, FIGS. 6-7 include an exploded cross-sectional view and a cross-sectional view, respectively, depicting a manner which a first microelectronic package 510 may be positioned in stacked relationship with a second microelectronic package 610 to produce a partially-completed stacked microelectronic package assembly with sidewalls 520, 620 of the packages 510, 610 substantially aligned in a co-planar manner, according to an embodiment. Any suitable number of additional device layers may also be included within a partially-completed stacked microelectronic package assembly. For convenience of explanation and illustration, microelectronic package 610 is illustrated and described as being substantially identical to microelectronic package 510. However, it is to be understood that microelectronic packages 510, 610 may be differently configured. According to an embodiment, however, microelectronic package 610 also includes one or more microelectronic devices 606 embedded in a microelectronic package body 608, and a plurality of device-to-edge conductors 602 (e.g., including metal traces) extending from electrical contact points 604 of device(s) 606 to the package sidewalls. In view of the illustrated orientation of the stacked microelectronic package assembly of FIGS. 6 and 7, microelectronic package 510 will be referred to below as "upper microelectronic package 510", while microelectronic package 610 will be referred to as "lower microelectronic package 610." It should be understood, however, that this terminology is used for convenience of reference only, that the orientation of the completed stacked microelectronic package assembly is arbitrary, and that the microelectronic package assembly may be inverted during later processing steps and/or when incorporated into a larger electronic system or device.

Figure 6:
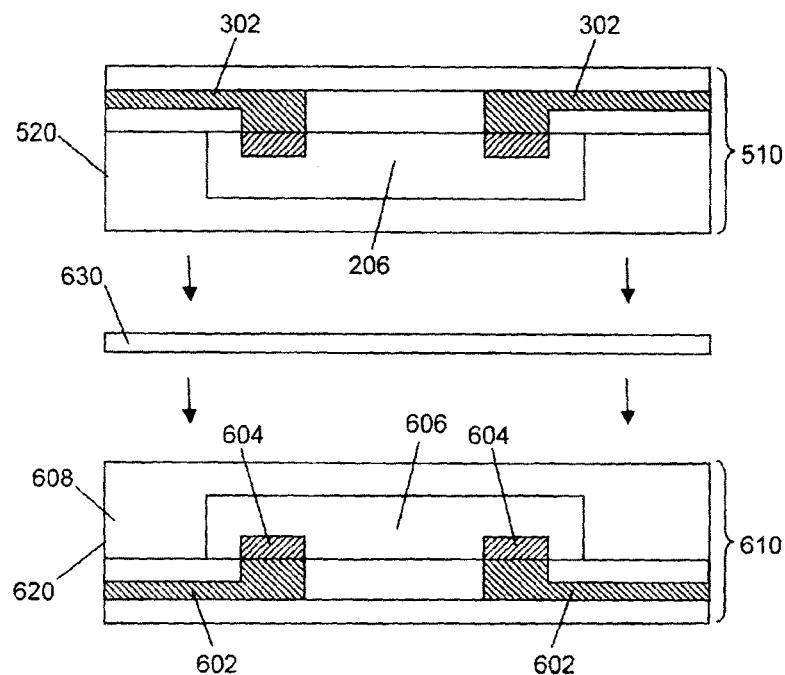
FIGS. 6-7 are exploded cross-sectional and cross-sectional views, respectively, depicting a manner which a first microelectronic package may be positioned in stacked relationship with a second microelectronic package to produce a partially-completed stacked microelectronic package assembly, according to an embodiment.
Figure 7:
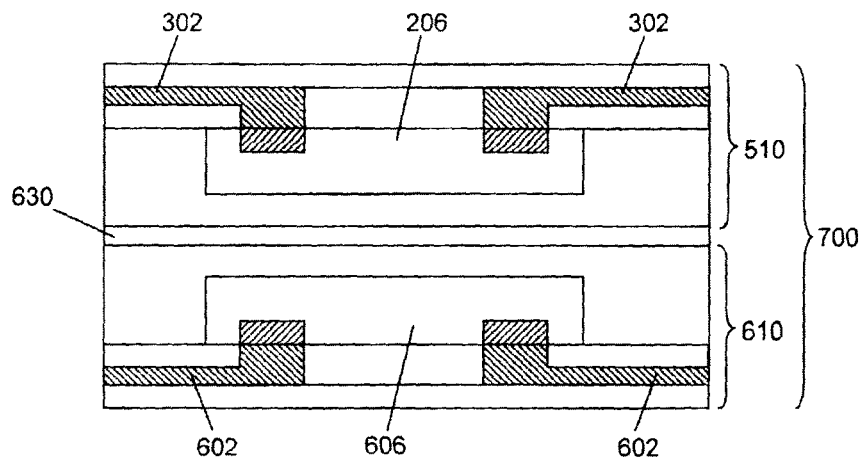

Microelectronic packages 510, 610 (and any additional microelectronic device packages included within the partially-completed stacked microelectronic package assembly) may be laminated or otherwise coupled together during process 104 of method 100. As indicated in FIGS. 6 and 7, this may be accomplished by applying or otherwise positioning an intervening bonding layer 630 between microelectronic packages 510, 610 prior to package stacking. Bonding layer 630 can be an epoxy or other adhesive, which may be applied over the upper surface of lower microelectronic package 610 and thermally cured after positioning of upper microelectronic package 510, for example. This example notwithstanding, any suitable bonding material or means can be utilized to bond microelectronic packages 510, 610 together including, for example, double-sided adhesive tape, dispensed adhesive, soldering, gluing, brazing, and so on. By coupling microelectronic packages 510, 610 together in this manner, the relative positioning of microelectronic packages 510, 610 and, therefore, the relative positioning of the microelectronic devices 206 and 606 embedded within microelectronic packages 510, 610 can be maintained during further processing. Microelectronic packages 510, 610, and any other microelectronic packages to be included within the stacked microelectronic package assembly can be tested prior to stacking to ensure that only known-good microelectronic packages are consolidated during process 104.

In the embodiment illustrated in FIGS. 6 and 7, microelectronic package 510 is positioned in a stacked relationship with one additional microelectronic package 610 after both packages 510, 610 have been singulated from a device panel (e.g., panel 300, FIG. 3). However, in other embodiments, microelectronic package 510 may be positioned in a stacked relationship with microelectronic package 610 prior to singulation of microelectronic package 610 from its corresponding device panel. In other words, multiple instances of singulated microelectronic package 510 may be stacked on and bonded to non-singulated instances of microelectronic packages 610. After bonding the singulated packages 510 to the non-singulated packages 610 of the device panel (e.g., in the above-described manner), the individual stacked microelectronic package assemblies may then be separated by singulation of the panel that includes microelectronic device packages 610. This alternative fabrication technique likewise yields a plurality of partially-completed stacked microelectronic package assemblies, such as the stacked microelectronic package assembly shown in FIG. 7. In still further embodiments, two or more device panels may be stacked, bonded, and then singulated to produce a plurality of partially-completed stacked microelectronic package assemblies during process 104. In any event, a composite package body 700 is formed from the combination of microelectronic packages 510, 610, in the embodiment illustrated in FIG. 7.

Although the example shown in FIG. 7 depicts a first surface of microelectronic package 510 bonded to a second surface of microelectronic package 610, a second surface of microelectronic package 510 may be bonded to the second surface of microelectronic package 610, the first surface of microelectronic package 510 may be bonded to the first surface of microelectronic package 610, or the second surface of microelectronic package 510 may be bonded to the first surface of microelectronic package 610. The foregoing processes are all considered to constitute the stacking of microelectronic device packages, whether stacking is performed utilizing multiple singulated packages, multiple non-singulated packages in the form of multiple device panels, or a combination of singulated packages and one or more device panels. Manufacturing techniques in which package stacking is performed on a partial or full panel level can facilitate the positioning and bonding of the stacked microelectronic package assemblies, thereby potentially improving throughput while reducing manufacturing time and cost.

Figure 8:
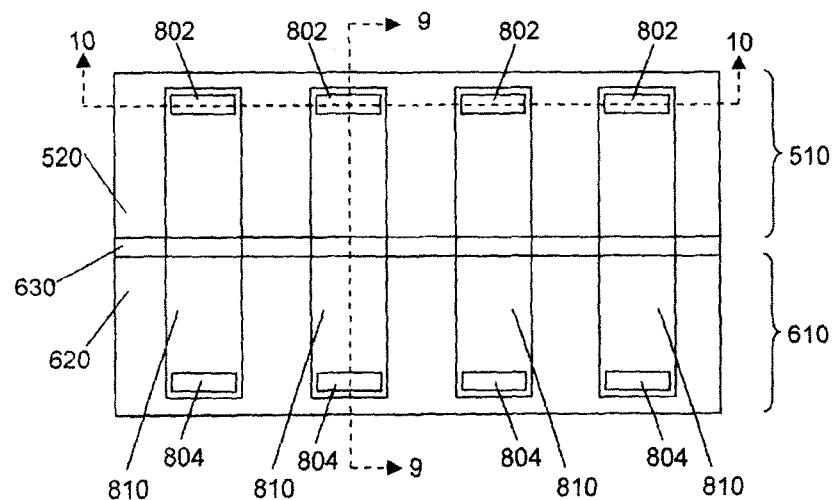
FIG. 8 illustrates a side view of the partially-completed, stacked microelectronic package assembly of FIG. 7 with sidewall trenches exposing the ends of device-to-edge conductors, according to an embodiment.

Referring again to FIG. 1 and also to FIG. 8, in process 106, cavities, openings, or trenches 810 suitable for later-formed sidewall conductors (e.g., sidewall conductors 1310, FIG. 13) are next formed in the package sidewalls 520, 620 and/or other surfaces by removing some of the encapsulating material from sidewalls 520, 620 of the package body 700. More specifically, the trenches 810 are formed to expose and extend between ends 802 of device-to-edge conductors 302 of package 510 and ends 804 of device-to-edge conductors 602 of microelectronic package 610. Trenches 810 can be formed using laser cutting, drilling, sawing, etching, or another suitable technique and can have the same width as edge conductors 302, 602, a smaller width than edge conductors 302, 602, or a larger width than edge conductors 302, 602, as shown in FIG. 8. According to an embodiment, trenches 810 have a depth (i.e., the dimension from a package surface to a bottom of a trench) in a range of about 1 micron to about 100 microns, and a width (i.e., the dimension between sides of a trench) in a range of about 15 microns to about 100 microns (e.g., the width may be equal to, greater than, or less than the width of the exposed ends 802, 804 of the edge conductors 302, 602). In other embodiments, the trench depth and/or width may be larger or smaller than the above-given ranges.

Trenches 810 may have a straight, linear configuration between the exposed ends 802, 804 of respective edge conductors 302, 602, as is shown in FIG. 8. Alternatively, trenches may be formed that have non-linear shapes (e.g., curved shapes, shapes that include adjoining linear segments at different orientations (e.g., zig-zag, stair step), and so on), and/or trenches may be formed that have horizontal and/or diagonal orientations. For improved manufacturing efficiency, formation of multiple trenches 810 can be carried-out in parallel using more than one laser, drill or saw. Alternatively, the trenches 810 may be formed sequentially using a single laser, drill or saw.

Figure 9:
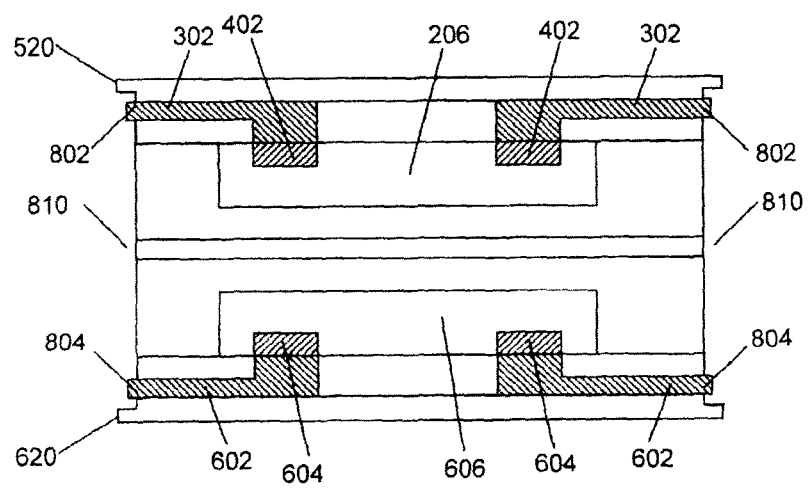
FIG. 9 illustrates a cross-sectional, side view of the partially-completed, stacked microelectronic package assembly of FIG. 8 along line 9-9.
Figure 10:
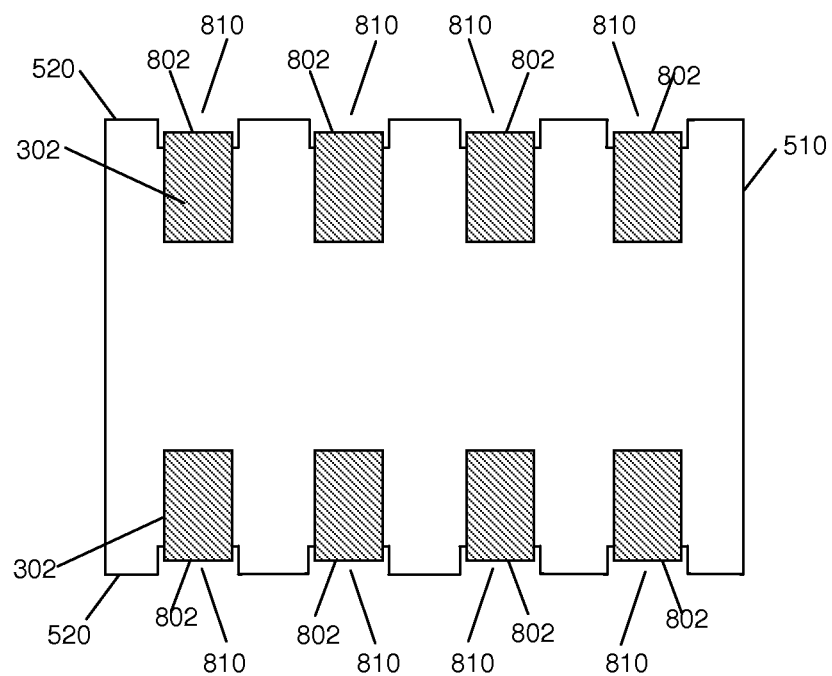
FIG. 10 illustrates a cross-sectional, top-down view of the partially-completed, stacked microelectronic package assembly of FIG. 8 along line 10-10.

FIG. 9 illustrates a cross-sectional, side view of the partially-completed, stacked microelectronic package assembly of FIG. 8 along line 9-9, and FIG. 10 illustrates a cross-sectional, top-down view of the partially-completed, stacked microelectronic package assembly of FIG. 8 along line 10-10. As can be seen in FIGS. 8 and 9, trenches 810 extend a depth below the package sidewall surfaces 520, 620, and the exposed ends 802, 804 of the device-to-edge conductors 302, 602 may extend into the trenches 810. This may occur, for example, when the conductive material forming the device-to-edge conductors 302, 602 has a higher ablation threshold using a laser (or whichever method is used to form trenches 810) than the encapsulating material of the microelectronic packages 510, 610. In some cases, depending on the selected conductive material and trench formation methods (e.g., material removal methods that are not selective to the conductive material), the exposed ends 802, 804 of the device-to-edge conductors 302, 602 may extend all the way to the sidewalls (e.g., they may be substantially co-planar with the package sidewalls 520, 620). In alternate embodiments, the exposed ends 802, 804 of the device-to-edge conductors 302, 602 may be essentially co-planar with the bottom surfaces of the trenches 810.

Referring again to FIG. 1, in processes 108 and 110, package sidewall conductors are then formed in the trenches 810. More specifically, the package sidewall conductors are formed by first depositing conductive material in the trenches 810 to electrically couple the exposed ends 802, 804 of the device-to-edge conductors 302, 602, in process 108. Then, in process 110, excess conductive material on the package surface(s) that was deposited during process 108 is removed.

According to an embodiment, which is explained in more detail in conjunction with FIGS. 11 and 13-15, below, the package sidewall conductors are formed by first depositing a layer of conductive material over the package surface(s) in which the trenches are formed, and subsequently removing the conductive material from the package surface(s) while retaining the material in the trenches. According to another embodiment, which is explained in more detail in conjunction with FIGS. 12 and 13-15, below, the package sidewall conductors are formed by first dispensing conductive material in the trenches, and subsequently removing any excess material that may have been deposited on the package surface(s) during the dispensing process. Each of these embodiments will be described in turn, below.

Figure 11:
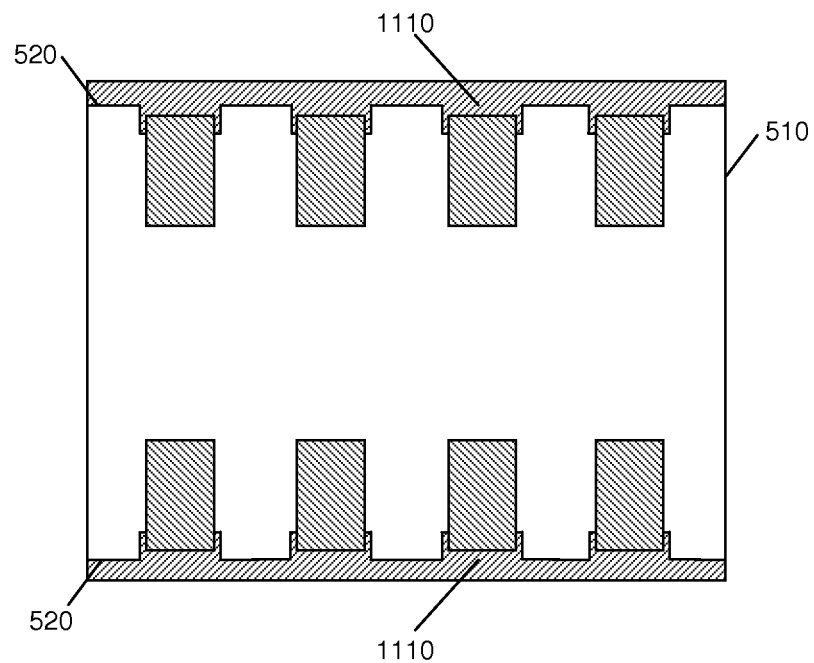
FIG. 11 illustrates a cross-sectional, top-down view of the partially-completed, stacked microelectronic package assembly of FIG. 10 after deposition of a conductive layer that fills the sidewall trenches, according to an embodiment.

Referring first to FIG. 11, which is a cross-sectional, top-down view of the partially-completed, stacked microelectronic package assembly of FIG. 10 at a subsequent stage of production, a layer of conductive material 1110 is deposited on the surfaces (in this case sidewalls 520, 620) of the package body 700 within which trenches 810 are formed. More specifically, the conductive material layers 1110 are deposited in such a way as to fill the trenches 810 with conductive material and to substantially cover the surfaces within which the trenches 810 are formed. Because the exposed ends 802, 804 of the device-to-edge conductors 302, 602 are exposed within the trenches, the conductive material within the trenches also serves to electrically coupled the exposed ends 802, 804 of the device-to-edge conductors 302, 602.

The conductive material layer 1110 may be deposited, for example, by coating, spraying, dispensing, evaporating, sputtering, jetting, or otherwise depositing the conductive material using another suitable process. According to an embodiment, the conductive material layer 1110 may include an electrically-conductive adhesive (ECA). In other embodiments, other suitable conductive materials may be used, including but not limited to conductive polymers and conducting polymers (e.g., polymers filled with conductive particles and/or nanoparticles such as metals (e.g., silver, nickel, copper, gold, and so on), alloys of metals, metal coated organic particles, metal coated ceramic particles), solder pastes, solder-filled adhesives, particle- and nanoparticle-filled inks, liquid metals (e.g., GaIn and other liquid metals), and metal-containing adhesives or epoxies, such as silver-, nickel-, and copper-filled epoxies (collectively referred to herein as "electrically-conductive pastes"). Suitable conductive materials also include low melting point metals and alloys lacking resins or fluxes (e.g., metals and alloys having melting points below 300° C.). Such materials include, but are not limited to, indium and bismuth.

After deposition of the conductive material layer 1110, a first curing process may be performed, in an embodiment. As used herein, the term "cure" means any process that causes deposited material (e.g., conductive material layer 1110 or conductive material 1210) to harden into a resilient solid structure, including sintering, exposing the material to chemical additives and/or gasses, and exposing the material to ultraviolet radiation, electron beams, or elevated temperatures. In an alternate embodiment, the first curing process may be excluded from the process.

Figure 13:
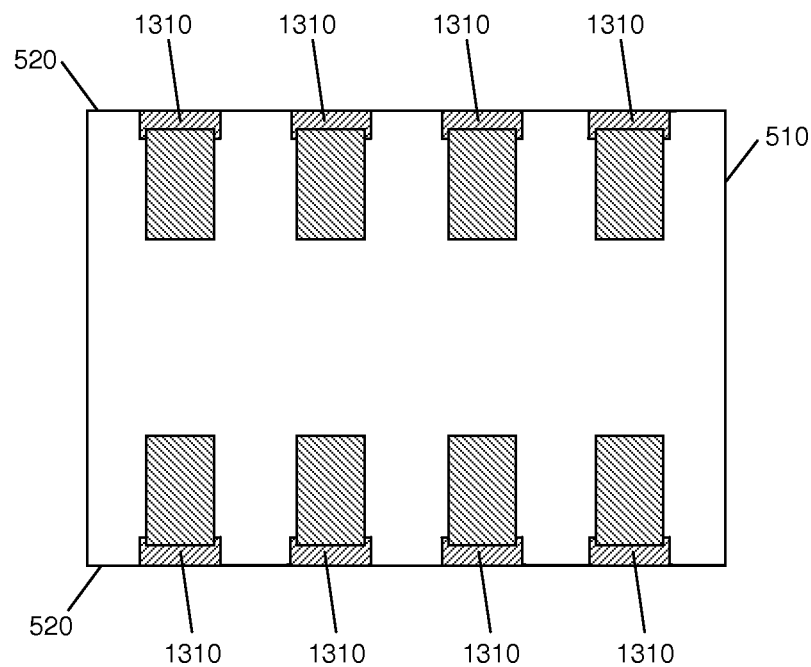
FIG. 13 illustrates a cross-sectional, top-down view of the completed stacked microelectronic package assembly of FIG. 11 or FIG. 12 after removal of conductive material from the sidewalls, according to an embodiment.

According to an embodiment, the portion of conductive material layer 1110 that is present on and/or above the sidewalls 520, 620 is removed (e.g., in process 110). This material, referred to as "excess conductive material," may be removed, for example, using a mechanical polish, a chemical mechanical polishing (CMP) process, laser ablation, a selective etching process, or another process that is suitable for removing substantially all of the portions of conductive material layer 1110 overlying at least those portions of the sidewalls 520, 620 that are adjacent to and/or between the trenches 810. According to an embodiment, the process does not result in removal of a significant portion of the conductive material layer 1110 within the trenches 810, however. Accordingly, referring to FIG. 13, which is a cross-sectional, top-down view of the partially-completed, stacked microelectronic package assembly after removal of excess conductive material, the process results in the formation of a distinct package sidewall conductor 1310 within each trench 810, where each package sidewall conductor 1310 electrically couples the exposed ends 802, 804 of the device-to-edge conductors 302, 602 within that trench 810 only. Further, FIG. 13 illustrates that the top surface of each package sidewall conductor 1310 may be substantially co-planar with the sidewalls 520. In other words, each trench 810 is completely filled with the conductive material forming the package sidewall conductor 1310. This result may be particularly achievable when a polishing technique is selected to remove the excess conductive material on the sidewalls 520, 530. As FIG. 13 also indicates, portions of package body encapsulant located between adjacent package sidewall conductors 1310 function to electrically insulate the adjacent sidewall conductors 1310 from each other. After removal of the excess conductive material overlying the sidewalls 520, 620, a final curing process may be performed, in an embodiment. The final curing process may be excluded, in another embodiment.

As mentioned above, according to another embodiment, the package sidewall conductors may be formed by first dispensing conductive material in the trenches 810, and subsequently removing any excess material that may have been deposited on the package surfaces during the dispensing process. For example, referring now to FIG. 12, which is a cross-sectional, top-down view of the partially-completed, stacked microelectronic package assembly of FIG. 10 at a subsequent stage of production, a conductive material 1210 is dispensed directly into the trenches 810, where the conductive material 1210 extends continuously between the exposed ends 802, 804 of the device-to-edge conductors 302, 602 within each trench 810.

In various embodiments, the conductive material 1210 may be dispensed within the trenches 810 by spraying, inkjet and/or aerosol jet printing, stencil printing, needle dispense, or another dispensing method. For some types of dispensing methods, the conductive material 1210 may be dispensed using multiple deposition passes, where each pass may successively increase the height of the conductive material 1210 within the trench 810. As with the previously described embodiment, the conductive material 1210 may include an ECA, a conductive polymer, a conducting polymer, a solder paste, a solder-filled adhesive, a particle- or nanoparticle-filled ink, a metal-containing adhesive or epoxy, a low melting point metals or alloys lacking resins or fluxes, or another suitable material. After dispensing the conductive material 1210, a first curing process may be performed, in an embodiment. The first curing process may be excluded from the process, in an alternate embodiment.

Figure 12:
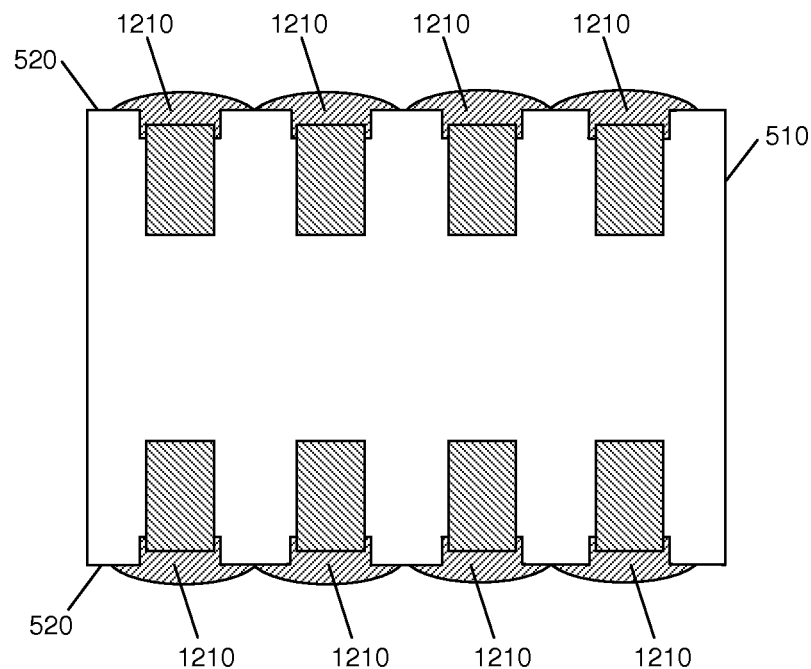
FIG. 12 illustrates a cross-sectional, top-down view of the partially-completed, stacked microelectronic package assembly of FIG. 10 after dispensing conductive material in the sidewall trenches, according to another embodiment.

As indicated in FIG. 12, the dispensing process may result in the presence of conductive material on the surfaces of the sidewalls 520, 620 between trenches 810. This excess conductive material, which alternatively may be referred to as "overspray," may result in undesired electrical conductivity (or shorts) between conductive traces within adjacent trenches. According to an embodiment, the excess conductive material 1210 present on and/or above the sidewalls 520, 620 is removed (e.g., in process 110) using a mechanical polish, a CMP process, laser ablation, a selective etching process, or another process that is suitable for removing substantially all of the conductive material 1210 overlying at least those portions of the sidewalls 520, 620 that are adjacent to and/or between the trenches 810. As with the previously described embodiment, the process does not result in removal of a significant portion of the conductive material 1210 within the trenches 810. Accordingly, referring again to FIG. 13, the process results in the formation of a distinct package sidewall conductor 1310 within each trench 810, where each package sidewall conductor 1310 electrically couples the exposed ends 802, 804 of the device-to-edge conductors 302, 602 within that trench 810 only. After removal of the excess conductive material overlying the sidewalls 520, 620, a final curing process may be performed, in an embodiment. The final curing process may be excluded, in another embodiment.

Figure 14:
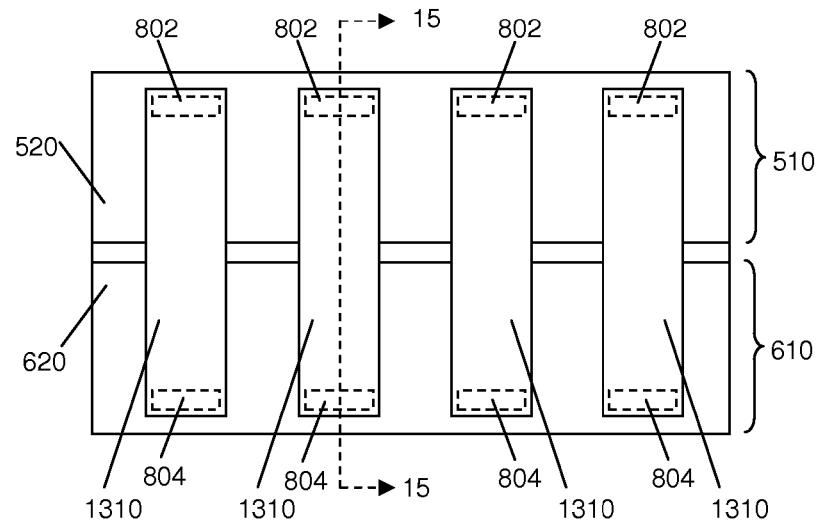
FIG. 14 illustrates a side view of the completed stacked microelectronic package assembly of FIG. 13.
Figure 15:
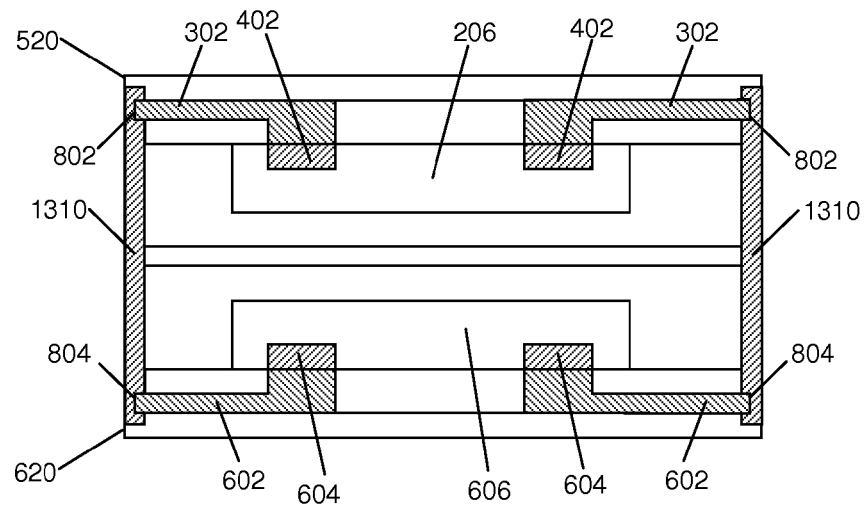
FIG. 15 illustrates a cross-sectional, side view of the completed stacked microelectronic package assembly of FIG. 14 along line 15-15.

FIG. 14 illustrates a side view of the completed stacked microelectronic package assembly of FIG. 13, and FIG. 15 illustrates a cross-sectional, side view of the completed stacked microelectronic package assembly of FIG. 14 along line 15-15. As shown in FIGS. 14 and 15, each package sidewall conductor 1310 includes a first portion in electrical contact with the exposed end 802 of a first device-to-edge conductor 302 (indicated with dashed lines as it would be hidden in the exterior view of FIG. 14), and a second portion in electrical contact with the exposed end 804 of a second device-to-edge conductor 602 (also indicated with dashed lines as it would be hidden in the exterior view of FIG. 14). Each package sidewall conductor 1310 electrically couples different ones (typically pairs) of device-to-edge conductors 302, 602, and thereby electrically interconnects the microelectronic packages 510, 610 and, more specifically, the microelectronic devices 206, 606 contained therein.

Although the embodiments discussed herein include package surface conductors that extend between device-to-edge conductors of different microelectronic packages within a stack, in other embodiments, package surface conductors may extend between multiple device-to-edge conductors of a same microelectronic package. In addition, although the Figures depict package surface conductors that extend in a vertical direction with respect to the package top and bottom surfaces (which are considered to be in horizontal planes), package surface conductors may extend in horizontal, diagonal, or other directions, as well, in other embodiments. Further, embodiments of the inventive subject matter may include devices in which adjacent conductors are formed in trenches in package surfaces other than sidewalls. For example, adjacent conductors may be formed on a top surface, a bottom surface, and/or on embedded surfaces (e.g., between package layers) of a microelectronic package. Accordingly, a "package surface," as used herein, may mean a sidewall, a top surface, a bottom surface, or an embedded surface. Further, a "package surface conductor," as used herein, may mean a conductor formed in trenches on a sidewall (e.g., a package sidewall conductor), a top surface, a bottom surface, or an embedded surface of a microelectronic package. For ease of illustration and explanation, however, the Figures and description depict and describe vertically-oriented package surface conductors that extend between device-to-edge conductors of stacked microelectronic packages (e.g., packages 510, 610). According to an embodiment, microelectronic packages 510, 610 are fabricated so that, once they are assembled together to form a microelectronic package assembly, pairs of sidewall pads (i.e., the exposed distal ends of a pair of the device-to-edge conductors) generally align with each other in a vertical direction. However, as package surface conductors may have non-linear shapes and/or non-vertical orientations, the sidewall pads within a pair may not be aligned with each other in a vertical direction, in other embodiments.

Figure 16:
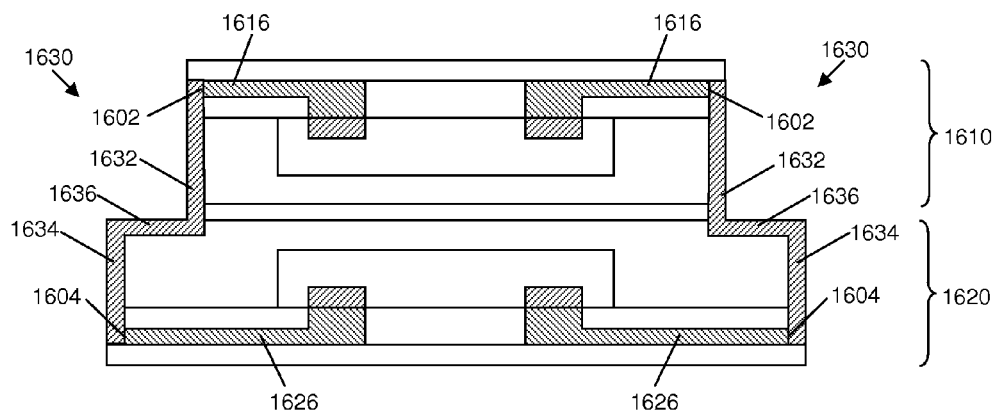
FIG. 16 illustrates a cross-sectional, side view of a completed stacked microelectronic package assembly, according to another embodiment.

Although the above described figures depict stacked microelectronic package assemblies in which sidewalls (e.g., sidewalls 520, 620) of the packages are substantially co-planar, the sidewalls of stacked packages forming a stacked microelectronic package assembly may not be co-planar, in other embodiments. For example, FIG. 16 illustrates a cross-sectional, side view of a completed stacked microelectronic package assembly, according to another embodiment. In the embodiment illustrated in FIG. 16, the width of top microelectronic package 1610 is smaller than the width of bottom microelectronic package 1620. In such an embodiment, package surface conductors 1630 between exposed ends 1602, 1604 of device-to-edge conductors 1616, 1626 can be formed in a stair step configuration. More particularly, in the illustrated embodiment, package sidewall conductors 1632, 1634 rise along the sidewalls of each microelectronic package 1610, 1620, and intermediate package surface conductors 1636 are formed in trenches on the top surface of the bottom microelectronic package 1620. The intermediate package surface conductors 1636 extend between and electrically couple corresponding pairs of package sidewall conductors 1632, 1634.

Although the above described figures depict package sidewalls that are substantially orthogonal to the top and bottom surfaces of a package, the package sidewalls may be non-orthogonal to the top and bottom surfaces of a package, in other embodiments. For example, FIG. 17 illustrates a cross-sectional, side view of a partially-completed stacked microelectronic package assembly with package sidewall conductors 1730 formed in trenches in non-orthogonal sidewalls of microelectronic packages 1710, 1720, according to yet another embodiment. As with the previously-described embodiments, each package sidewall conductor 1730 electrically couples exposed ends 1702, 1704 of at least two device-to-edge conductors 1716, 1726. Implementation of the various embodiments using devices (e.g., devices 1710, 1720) with non-orthogonal sidewalls may have some manufacturing advantages. For example, in an embodiment in which the sidewall conductors 1730 are dispensed into trenches using a print head, the print head may be positioned vertically during the dispensing process (e.g., pointed straight down toward the sidewalls), rather than at a non-vertical angle, as would likely be implemented for dispensing sidewall conductors on sidewalls that are orthogonal to the top and bottom package surfaces.

Although the various embodiments illustrated in the Figures and described above include vertically-oriented package sidewall conductors that interconnect vertically aligned sidewall pads of stacked packages, other embodiments also or alternatively may include horizontally-oriented package sidewall conductors that interconnect horizontally aligned sidewall pads of a single microelectronic package or multiple microelectronic packages. In addition, other embodiments may include package sidewall conductors that interconnect sets of more than two sidewall pads, and/or package sidewall conductors having shapes that are different from simple linear shapes, as discussed previously. Further, in some embodiments, adjacent sidewall conductors may couple to one or more common sidewall pads. In addition, in still other alternate embodiments, a stacked microelectronic package assembly may include any number or combination of the package sidewall conductor and intra-conductor insulating structure embodiments discussed herein. All such embodiments are intended to be included within the scope of the inventive subject matter.

An embodiment of a method includes forming a trench on a surface of a package body between a first exposed end of a first device-to-edge conductor and a second exposed end of a second device-to-edge conductor, and forming a package surface conductor in the trench to electrically couple the first device-to-edge conductor and the second device-to-edge conductor. According to a further embodiment, forming the package surface conductor includes forming a conductive material layer over the package surface, where the conductive material layer substantially fills the trench, and removing portions of the conductive material layer from the package surface adjacent to the trench. According to another further embodiment, forming the package surface conductor includes dispensing one or more conductive materials in the trench between the first and second exposed ends using one or more dispensing methods selected from spraying, inkjet printing, aerosol jet printing, stencil printing, and needle dispense. In such an embodiment, forming the package surface conductor may further include removing the one or more conductive materials from the package surface adjacent to the trench.

Another embodiment of a method includes forming a plurality of trenches on a surface of a package body between a plurality of first exposed ends of first device-to-edge conductors and a plurality of second exposed ends of second device-to-edge conductors, depositing one or more conductive materials in each of the plurality of trenches to electrically couple the first device-to-edge conductors and the second device-to-edge conductors, and performing a material removal process to remove the one or more conductive materials from portions of the surface between the plurality of trenches. According to a further embodiment, depositing the one or more conductive materials includes forming a conductive material layer over the surface, where the conductive material layer substantially fills the plurality of trenches and substantially covers the surface. According to another further embodiment, depositing the one or more conductive materials comprises dispensing the one or more conductive materials in the plurality of trenches between the first and second exposed ends using one or more dispensing methods selected from spraying, inkjet printing, aerosol jet printing, stencil printing, and needle dispense.

An embodiment of a device includes a package body, a trench, and a package surface conductor. The package body has a package surface, a first device-to-edge conductor, and a second device-to-edge conductor. The trench is formed in the package surface between a first exposed end of the first device-to-edge conductor and a second exposed end of the second device-to-edge conductor. The package surface conductor in the trench electrically couples the first device-to-edge conductor and the second device-to-edge conductor.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the disclosure are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical (e.g., mechanical) manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

While at least one embodiment has been presented in the foregoing Detailed Description, it should be appreciated that a vast number of variations exist. It should also be appreciated that the embodiment or embodiments are only examples, and are not intended to limit the scope, applicability, or configuration of the disclosure in any way. Rather, the foregoing Detailed Description will provide those skilled in the art with a convenient road map for implementing embodiments of the disclosure. It being understood that various changes may be made in the function and arrangement of elements described in an embodiment without departing from the scope of the disclosure as set-forth in the appended claims.

What is claimed is:

1. A device, comprising: a package body having a package surface, a first device-to-edge conductor, and a second device-to-edge conductor; a trench formed in the package surface between a first exposed end of the first device-to-edge conductor and a second exposed end of the second device-to-edge conductor; and a package surface conductor in the trench which electrically couples the first device-to-edge conductor and the second device-to-edge conductor, one or more additional trenches in the package surface between one or more additional first exposed ends of one or more additional first device-to-edge conductors and one or more additional second exposed ends of one or more additional second device-to-edge conductors; and one or more additional package surface conductors in the one or more additional trenches to electrically couple the one or more additional first device-to-edge conductors and the one or more additional second device-to-edge conductors.

2. The device of claim 1, wherein the package surface conductor has a surface that is co-planar with the package surface.

3. The device of claim 1, wherein the package body comprises:
a first microelectronic package that has an embedded first microelectronic device that is electrically coupled with the first device-to-edge conductor, and a first sidewall that forms a first portion of the package surface;

a second microelectronic package stacked on the first microelectronic package, wherein the second microelectronic package has an embedded second microelectronic device that is electrically coupled with the second device-to-edge conductor, and a second sidewall that forms a second portion of the package surface.

4. The device of claim 1, wherein the package surface conductor is formed from one or more conductive materials selected from an electrically conductive adhesive, conductive polymer, a polymer filled with conductive particles, a metal alloy, metal coated organic particles, metal coated ceramic particles, solder paste, solder-filled adhesive, nanoparticle-filled ink, a liquid metal, a metal-containing adhesive, a metal-containing epoxies, electrically-conductive pastes, indium, and bismuth.

* * * * *